(12) United States Patent
Medendorp, Jr.

(10) Patent No.: US 8,669,573 B2
(45) Date of Patent: Mar. 11, 2014

(54) PACKAGED SEMICONDUCTOR LIGHT EMITTING DEVICES HAVING MULTIPLE OPTICAL ELEMENTS

(75) Inventor: Nicholas W. Medendorp, Jr., Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/984,242

(22) Filed: Jan. 4, 2011

(65) Prior Publication Data

US 2011/0101385 A1    May 5, 2011

Related U.S. Application Data

(63) Continuation of application No. 11/705,233, filed on Feb. 12, 2007.

(51) Int. Cl.
*H01L 33/00* (2010.01)
(52) U.S. Cl.
USPC ................................. 257/98; 257/79; 438/29
(58) Field of Classification Search
USPC ........ 257/98–100, 787, 257; 313/503; 438/29
See application file for complete search history.

(56) References Cited

U.S. PATENT DOCUMENTS

| 4,918,497 | A | 4/1990 | Edmond | 357/17 |
|---|---|---|---|---|
| 4,966,862 | A | 10/1990 | Edmond | 437/100 |
| 5,027,168 | A | 6/1991 | Edmond | 357/17 |
| 5,210,051 | A | 5/1993 | Carter, Jr. | 437/107 |
| 5,277,840 | A | 1/1994 | Osaka et al. | 252/301.36 |
| 5,338,944 | A | 8/1994 | Edmond et al. | 257/76 |
| 5,393,993 | A | 2/1995 | Edmond et al. | 257/77 |
| 5,416,342 | A | 5/1995 | Edmond et al. | 257/76 |
| 5,523,589 | A | 6/1996 | Edmond et al. | 257/77 |
| 5,604,135 | A | 2/1997 | Edmond et al. | 437/22 |
| 5,631,190 | A | 5/1997 | Negley | 438/33 |
| 5,739,554 | A | 4/1998 | Edmond et al. | 257/103 |
| 5,813,753 | A | 9/1998 | Vriens et al. | 362/293 |
| 5,858,278 | A | 1/1999 | Itoh et al. | 252/301.4 |
| 5,912,477 | A | 6/1999 | Negley | 257/95 |
| 5,959,316 | A | 9/1999 | Lowery | 257/98 |
| 5,998,925 | A | 12/1999 | Shimizu et al. | |
| 6,069,440 | A | 5/2000 | Shimizu et al. | 313/486 |

(Continued)

FOREIGN PATENT DOCUMENTS

| CN | 1822365 A | 8/2006 |
|---|---|---|
| JP | 63129638 | 6/1988 |

(Continued)

OTHER PUBLICATIONS

U.S. Appl. NO. 11/751,990, filed May 22, 2007, Negley.

(Continued)

*Primary Examiner* — Kimberly Rizkallah
*Assistant Examiner* — Errol Fernandes
(74) *Attorney, Agent, or Firm* — Myers Bigel Sibley & Sajovec, P.A.

(57) ABSTRACT

Methods of packaging a semiconductor light emitting device include providing a substrate having the semiconductor light emitting device on a front face thereof. A first optical element is formed from a first material on the front face proximate the semiconductor light emitting device but not covering the semiconductor light emitting device and a second optical element is formed from a second material, different from the first material, over the semiconductor light emitting device and the first optical element. Packaged semiconductor light emitting devices are also provided.

13 Claims, 5 Drawing Sheets

(56) References Cited

U.S. PATENT DOCUMENTS

| | | | |
|---|---|---|---|
| 6,077,724 A | 6/2000 | Chen | 438/107 |
| 6,084,252 A | 7/2000 | Isokawa et al. | |
| 6,120,600 A | 9/2000 | Edmond et al. | 117/89 |
| 6,187,606 B1 | 2/2001 | Edmond et al. | 438/46 |
| 6,201,262 B1 | 3/2001 | Edmond et al. | 257/77 |
| 6,204,523 B1 | 3/2001 | Carey et al. | |
| 6,252,254 B1 | 6/2001 | Soules et al. | 257/89 |
| 6,274,924 B1 | 8/2001 | Carey et al. | 257/676 |
| 6,518,600 B1 | 2/2003 | Shaddock | |
| 6,521,916 B2 | 2/2003 | Roberts et al. | |
| 6,576,931 B2 | 6/2003 | Furukawa et al. | |
| 6,590,235 B2 | 7/2003 | Carey et al. | |
| 6,635,363 B1 | 10/2003 | Duclos et al. | 428/690 |
| 6,747,406 B1 | 6/2004 | Bortscheller et al. | 313/512 |
| 6,936,852 B2 | 8/2005 | Furukawa et al. | |
| 6,963,166 B2 | 11/2005 | Yano et al. | |
| 7,105,863 B1 | 9/2006 | Ng et al. | |
| 7,126,274 B2 | 10/2006 | Shimizu et al. | |
| 7,215,074 B2 | 5/2007 | Shimizu et al. | |
| 7,355,284 B2 | 4/2008 | Negley | |
| 7,405,433 B2 | 7/2008 | Chew | |
| 7,514,867 B2 | 4/2009 | Yano et al. | |
| 7,714,347 B2* | 5/2010 | Chen et al. | 257/99 |
| 2002/0123164 A1 | 9/2002 | Slater, Jr. et al. | 438/39 |
| 2002/0187260 A1 | 12/2002 | Sheppard et al. | 427/248.1 |
| 2003/0006418 A1 | 1/2003 | Emerson et al. | 257/79 |
| 2003/0054184 A1 | 3/2003 | Miyadera et al. | 428/473.5 |
| 2003/0168670 A1 | 9/2003 | Roberts et al. | |
| 2004/0000727 A1* | 1/2004 | Hsu | 257/787 |
| 2004/0041222 A1 | 3/2004 | Loh | 257/433 |
| 2004/0056260 A1 | 3/2004 | Slater, Jr. et al. | 257/79 |
| 2004/0056265 A1* | 3/2004 | Arndt et al. | 257/98 |
| 2005/0046011 A1 | 3/2005 | Chen et al. | 257/705 |
| 2005/0046941 A1 | 3/2005 | Satoh et al. | 359/483 |
| 2005/0226636 A1* | 10/2005 | Hiramatsu et al. | 398/182 |
| 2006/0001055 A1* | 1/2006 | Ueno et al. | 257/257 |
| 2006/0102917 A1* | 5/2006 | Oyama et al. | 257/99 |
| 2006/0105485 A1 | 5/2006 | Basin et al. | 438/27 |
| 2006/0192224 A1* | 8/2006 | Ono | 257/99 |
| 2007/0057268 A1 | 3/2007 | Hamanaka et al. | 257/98 |
| 2007/0170454 A1* | 7/2007 | Andrews | 257/100 |
| 2007/0189007 A1* | 8/2007 | Nishimoto et al. | 362/227 |
| 2008/0074032 A1* | 3/2008 | Yano et al. | 313/503 |
| 2008/0194061 A1 | 8/2008 | Medendorp | |

FOREIGN PATENT DOCUMENTS

| | | |
|---|---|---|
| JP | 5235487 A | 9/1993 |
| JP | 6045659 A | 2/1994 |
| JP | 11183819 A | 7/1999 |
| JP | 11-289110 A | 10/1999 |
| JP | 2000200927 A | 7/2000 |
| JP | 2000302841 A | 10/2000 |
| JP | 2001118865 A | 4/2001 |
| JP | 2001-237462 A | 8/2001 |
| JP | 2002-344030 A | 11/2002 |
| JP | 2003046140 | 2/2003 |
| JP | 2003-218399 A | 7/2003 |
| JP | 2004071895 A | 3/2004 |
| JP | 2005311314 A | 11/2005 |
| JP | 2006-032370 A | 2/2006 |
| JP | 2006-066786 A | 3/2006 |
| JP | 2006059851 A | 3/2006 |
| JP | 2006093354 A | 4/2006 |
| JP | 2006140362 | 6/2006 |
| JP | 2006148147 A | 6/2006 |
| JP | 2006229054 A | 8/2006 |
| JP | 2006229055 | 8/2006 |
| JP | 2006229055 A | 8/2006 |
| JP | 2006-295228 A | 10/2006 |
| JP | 2006287032 | 10/2006 |
| WO | WO 2005/010427 A1 | 11/2005 |
| WO | WO 2005/104247 A | 11/2005 |
| WO | WO 2007/015426 A1 | 2/2007 |

OTHER PUBLICATIONS

International Search Report and Written Opinion (9 pages) corresponding to International Application No. PCT/US07/12158; Mailing Date: May 2, 2008.

International Search Report and Written Opinion (6 pages) corresponding to International Application No. PCT/US07/12158; Mailing Date: Jun. 9, 2008.

Notification of Transmittal of International Preliminary Report on Patentability (11 pages) corresponding to International Application No. PCT/US07/12158; Mailing Date: Nov. 3, 2008.

International Search Report and Written Opinion (9 pages) corresponding to International Application No. PCT-US07-12158; Mailing Date: May 2, 2008.

International Search Report and Written Opinion (6 pages) corresponding to International Application No. PCT-US07-12158; Mailing Date: Jun. 9, 2008.

Notification of Transmittal of International Preliminary Report on Patentability (11 pages) corresponding to International Application No. PCT-US07-12158; Mailing Date: Nov. 3, 2008.

Japanese Office Action for corresponding JP application No. 2008-030633 mailed May 24, 2011 with translation.

Office Action for corresponding Japanese Application No. 2008-030634 mailed Dec. 16, 2011 and translation thereof.

Chinese Third Office Action Corresponding to Chinese Patent Application No. 200810088194.X; Date of Issue: Nov. 6, 2012; 7 Pages.

Japanese Office Action Corresponding to Japanese Patent Application No. 2011-034183; Mailing Date: Dec. 4, 2012; 3 Pages (Foreign Text Only).

Japanese Office Action, Japanese Patent Application No. 097104985; Issuance: Nov. 7, 2013; 9 Pages.

Taiwanese Office Action, Taiwanese Patent Application No. 097104985; Issuance: Nov. 7, 2013; 9 Pages.

* cited by examiner

PACKAGED SEMICONDUCTOR LIGHT EMITTING DEVICES HAVING MULTIPLE OPTICAL ELEMENTS

CROSS-REFERENCE TO RELATED APPLICATION

This application is a continuation of U.S. patent application Ser. No. 11/705,233, filed on Feb. 12, 2007, the disclosure of which is hereby incorporated herein by reference in its entirety.

BACKGROUND OF THE INVENTION

This invention relates to semiconductor light emitting devices and manufacturing methods therefor, and more particularly to packaging and packaging methods for semiconductor light emitting devices.

Semiconductor light emitting devices, such as Light Emitting Diodes (LEDs) or laser diodes, are widely used for many applications. As is well known to those having skill in the art, a semiconductor light emitting device includes one or more semiconductor layers that are configured to emit coherent and/or incoherent light upon energization thereof. It is also known that the semiconductor light emitting device generally is packaged to provide external electrical connections, heat sinking, lenses or waveguides, environmental protection and/or other functions.

For example, it is known to provide a two-piece package for a semiconductor light emitting device, wherein the semiconductor light emitting device is mounted on a substrate that comprises alumina, aluminum nitride and/or other materials, which include electrical traces thereon, to provide external connections for the semiconductor light emitting device. A second substrate, which may comprise silver plated copper, is mounted on the first substrate, for example, using glue, surrounding the semiconductor light emitting device. A lens may be placed on the second substrate over the semiconductor light emitting device. Light emitting diodes with two-piece packages as described above are described in Application Serial No. US 2004/0041222 A1 to Loh, entitled Power Surface Mount Light Emitting Die Package, published Mar. 4, 2004, assigned to the assignee of the present invention, the disclosure of which is hereby incorporated herein by reference in its entirety as if set forth fully herein.

With multipart mounting packages for semiconductor light emitting devices, the different parts are typically made of different materials. As a result, the thermal impedance for such packages may be higher and a thermal mismatch may result among the various components within a package that may cause reliability problems with a package. For example, problems may result at an interface between a copper metal of a heat sink or cavity with a plastic of a body in which such a heat sink or cavity is mounted. In addition, assembly may be more complicated because of increased piece part counts for the package. In addition, where a sheet metal optical cavity is utilized, a cavity typically can only be fabricated in a limited range of depth and shape configurations. Such multipart packages may also have a larger optical cavity space, resulting in greater volumes of encapsulant being used, which may increase problems related to delamination and/or formation of bubbles within the encapsulant during temperature cycles.

The use of a pre-molded lens attached by adhesive may encounter some problems in robustness and reliability of the finished product. For example, the manufacturing process for such devices may be inherently inconsistent and the resultant package may be less robust and/or reliable. It is also known to form the lens using a dispensing method capitalizing on the viscosity of a resin used in forming the lens.

In some applications, it may be preferred to mount the LED on a surface of a substrate, such as a ceramic substrate, a metal core printed circuit board (MCPCB), a flexible circuit substrate and/or a lead frame, without use of a reflector cup. However, where no such structure is provided, it may be more difficult to form and/or secure a lens as various of the approaches described above may not be well suited to use where the LED is not positioned within a cavity.

It is also known to use transfer molding of epoxy to encapsulate certain low power LED packages, such as miniature surface mountable devices available from from Hewlett Packard Corporation. The epoxy on such devices may provide the structural strength to the package as well as encapsulating the devices inside. However, epoxy tends to be degraded by the electromagnetic energy of blue light, generally generated by some semiconductor light emitting devices, and may become less transmissive to light as a result. The resulting package may, therefore, become dimmer over a relatively short period of time. As such, epoxy may be a less attractive option for encapsulating devices that emit blue light. In addition, epoxy generally has a Coefficient of Thermal Expansion (CTE) mismatch problem with silicone soft gel, which may be used to junction coat the LED chips and their bond wires as the first layer of encapsulant.

It is also known to use casting to encapsulate LED devices with epoxy. This process typically can only be applied to an open chamber, where curing may occur with the epoxy contained in a cup and a lead frame may be inserted inside the cup and be casted when the epoxy is cured. During curing, a level of liquid epoxy is generally free to adjust itself as a result of chemical reactions and shrinkage in volume.

Another approach uses compression molded lenses formed of silicone. Using compression molding, an array of compression molded lenses may be placed over a matching array of LED chips on a substrate or wafer. However, conventional compression molding of lenses generally requires the use of electrical contacts on the back side, rather than the front side, of the substrate as the molding material may extend across and limit formation of electrical connections with front side contacts.

Packaging of semiconductor light emitting devices may add cost to the resulting packaged device due to the precision required for various operations. The costs typically increase as packaged light emitting devices having different optical properties are required. While compression molding technology has been proposed that could lower the cost for forming packaged light emitting devices, benefits of this technology have not been fully realized. For example, such techniques have generally only been used to produce simple lenses made of one material.

SUMMARY OF THE INVENTION

Some embodiments of the present invention provide methods of packaging a semiconductor light emitting device including providing a substrate having the semiconductor light emitting device on a front face thereof. A first optical element is formed from a first material on the front face proximate the semiconductor light emitting device but not covering the semiconductor light emitting device and a second optical element is formed from a second material, different from the first material, over the semiconductor light emitting device and the first optical element.

In other embodiments, at least one of forming the first optical element or forming the second optical element comprises compression molding the respective optical element. The first optical element and the second optical element may have different refractive indexes selected to provide a desired optical characteristic for the packaged semiconductor light emitting device. The first and second optical elements may be configured to provide a selected viewing angle to the packaged semiconductor light emitting device. Forming the first optical element may include forming the first optical element using a process other than compression molding.

In further embodiments, the first material has an adhesion characteristic selected to facilitate adhesion of the first optical element to the substrate during compression molding and/or to limit stress applied to the light emitting device and/or a wire bond coupled thereto during thermal cycling of the packaged semiconductor light emitting device. Providing the substrate may include mounting the semiconductor light emitting device flush on the front face thereof without a reflector cavity and the second optical element may be molded to and extend from the front face of the substrate in a region surrounding the semiconductor light emitting device and extends over the semiconductor light emitting device.

In other embodiments, the substrate includes a plurality of semiconductor light emitting devices on the front face thereof. Forming the first optical element and forming the second optical element include forming a plurality of first optical elements and forming a plurality of second optical elements on the front face of the substrate over corresponding ones of the semiconductor light emitting devices.

In further embodiments, methods of packaging a semiconductor light emitting device include providing a substrate having the semiconductor light emitting device on a front face thereof. A first optical element is formed from a first material on the front face proximate the semiconductor light emitting device and a second optical element is formed from a second material, different from the first material, over the semiconductor light emitting device and the first optical element. Forming the first optical element includes forming the first optical element using a process other than compression molding and forming the second optical element includes compression molding the respective optical element on the front face. The process other than compression molding may be dispensing and/or bonding. The first optical element and the second optical element may have different refractive indexes selected to provide a desired optical characteristic for the packaged semiconductor light emitting device.

In yet other embodiments, methods of packaging a semiconductor light emitting device include providing a substrate having the semiconductor light emitting device on a front face thereof. A first optical element is formed from a first material on the front face proximate the semiconductor light emitting device and a second optical element is formed from a second material, different from the first material, over the semiconductor light emitting device and the first optical element without leaving a gap between the first optical element and the second optical element. The first optical element and the second optical element have different refractive indexes selected to provide a desired optical characteristic for the packaged semiconductor light emitting device. At least one of forming the first optical element or forming the second optical element may include compression molding the respective optical element and In further embodiments, packaged semiconductor light emitting devices include a substrate and a semiconductor light emitting device on a front face of the substrate. A first optical element is on the front face of the substrate proximate the semiconductor light emitting device but not covering the semiconductor light emitting device and a second optical element is on the front face of the substrate over the semiconductor light emitting device and the first optical element.

In other embodiments, the semiconductor light emitting device is flush on the front face of the substrate without a reflector cavity and the second optical element extends from the front face of the substrate in a region surrounding the semiconductor light emitting device and extends over the semiconductor light emitting device. The semiconductor light emitting device may include a plurality of semiconductor light emitting devices and the compression molded optical elements may be a plurality of optical elements over corresponding ones of the semiconductor light emitting devices. A wire bond may be provided that electrically couples the semiconductor light emitting device to a contact portion of the substrate and at least one of the optical elements may be a compression molded optical element that directly contacts the wire bond. The first optical element may be a first material having an adhesion characteristic selected to facilitate adhesion of the first optical element to the substrate during compression molding and/or to limit stress applied to the light emitting device and/or a wire bond coupled thereto during thermal cycling of the packaged semiconductor light emitting device.

In yet further embodiments, packaged semiconductor light emitting devices include a substrate and a semiconductor light emitting device on a front face of the substrate. A first optical element is on the front face of the substrate proximate the semiconductor light emitting device. The first optical element is a first material. A second optical element is on the front face of the substrate over the semiconductor light emitting device and the first optical element with no gap between the first optical element and the second optical element. The second optical element is a second material, different from the first material. The first optical element and the second optical element have different refractive indexes selected to provide a desired optical characteristic for the packaged semiconductor light emitting device. The first optical element may be on the front face of the substrate proximate the semiconductor light emitting device but not covering the semiconductor light emitting device and the second optical element may be on the front face of the substrate over the semiconductor light emitting device and the first optical element

DETAILED DESCRIPTION

Figure 1:
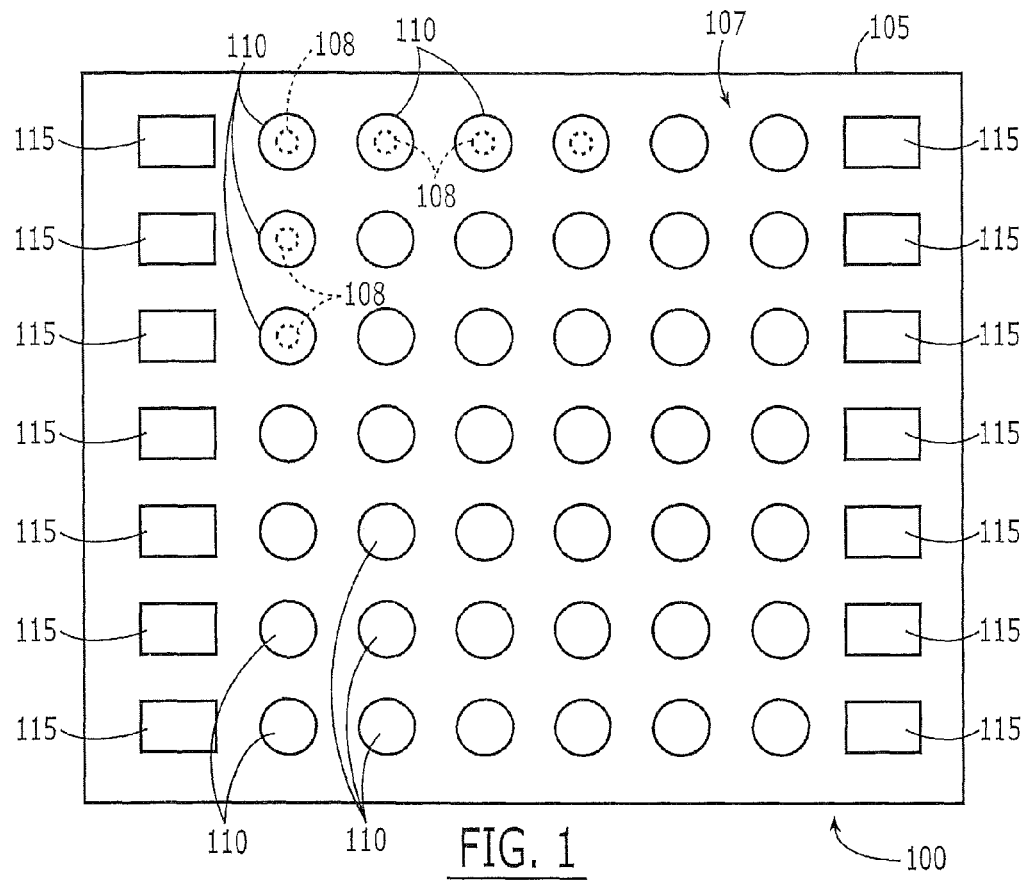
FIG. 1 is a top plan view of a packaged semiconductor light emitting device according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Embodiments of packaged semiconductor light emitting devices and methods for forming the same will now be described with reference to FIGS. 1-9. Referring first to FIG. 1, a packaged semiconductor light emitting device 100 is schematically illustrated in top plan view. More particularly the illustrated device 100 is shown as including a substrate 105 having a plurality of semiconductor light emitting devices 108 mounted in array arrangement on a front face 107 of the substrate 105. A compression molded optical element 110, shown as a lens, is formed on the front face 107 of the substrate 105 over respective semiconductor light emitting devices 108.

The semiconductor light emitting device(s) 108 can comprise a light emitting diode, laser diode and/or other device which may include one or more semiconductor layers, which may comprise silicon, silicon carbide, gallium nitride and/or other semiconductor materials, a substrate which may comprise sapphire, silicon, silicon carbide, gallium nitride or other microelectronic substrates, and one or more contact layers which may comprise metal and/or other conductive layers. The design and fabrication of semiconductor light emitting devices are well known to those having skill in the art.

For example, the light emitting device(s) 108 may be gallium nitride based LEDs or lasers fabricated on a silicon carbide substrate such as those devices manufactured and sold by Cree, Inc. of Durham, N.C. For example, the present invention may be suitable for use with LEDs and/or lasers as described in U.S. Pat. Nos. 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in United States Patent Application No. US 2004/0056260 A1, published on Mar. 25, 2004, entitled Phosphor-Coated Light Emitting Diodes Including Tapered Sidewalls, and Fabrication Methods Therefor, the disclosure of which is incorporated by reference herein as if set forth fully, may also be suitable for use in embodiments of the present invention.

In still other embodiments, a drop of a material such as epoxy that contains phosphor therein may be placed on the semiconductor light emitting device. LEDs that employ phosphor coatings are described, for example, in U.S. Pat. Nos. 6,252,254; 6,069,440; 5,858,278; 5,813,753; 5,277,840; and 5,959,316.

Also shown on the front face 107 of the substrate 105 is a plurality of electrical contacts 115. For example, the contacts 115 may be gold plated electrical contact pads connecting the semiconductor light emitting devices 108 to electrical circuits, power sources and the like. It will be understood that, while only contacts on the front face 107 are discussed herein, backside contacts may also be provided in some embodiments.

As will be described further herein, methods are provided in certain embodiments of the present invention whereby a compression molded lenses 110 may be formed on front face 107 of the substrate 105 while still using front face contacts 115 and allowing electrical connections to the front face 107 without interference from residual deposits of the non-conductive material used to form the lenses 110. Furthermore, residual silicone used in forming the lenses 110 may remain on the surfaces of the front face 107 to which no electrical contact is required in some embodiments of the present invention.

It will be understood that the arrangement shown in FIG. 1 is for exemplary purposes and that a variety of different configurations and combinations of one or more semiconductor light emitting devices 108 and contacts 115 may be included in the package semiconductor light emitting device 100 in various embodiments of the present invention, including devices having only a single light emitting device 108. Similarly, it will be understood that the structure 100 illustrated in FIG. 1 may, in some embodiments, be further processed with portions thereof separated to provide a plurality of discrete packaged semiconductor light emitting devices formed from the illustrated device 100.

Depending on the embodiments, the substrate can included embedded electrical connections to form a string or cluster of LEDs between electrical contacts 115 to provide individual front side contact LEDs and/or strings or clusters of LEDs. Additionally, the individual LEDs with lenses can each include contacts to enable the LEDs.

Figure 7:
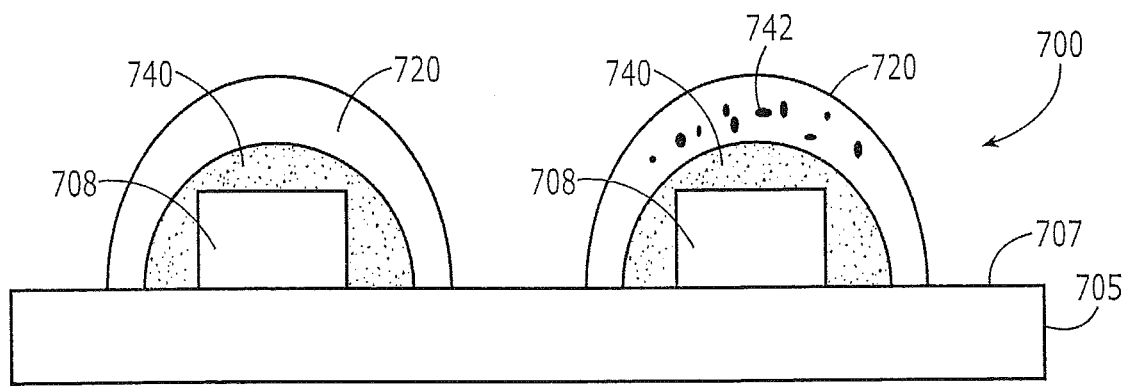
FIG. 7 is a cross sectional view of a packaged semiconductor light emitting device according to other embodiments of the present invention.

Semiconductor light emitting devices 108 may, in some embodiments of the present invention, be mounted flush on the front face 107 on the substrate 105 without a reflector cavity surrounding the light emitting devices 108 as seen, for example, in FIG. 7.

Figure 2:
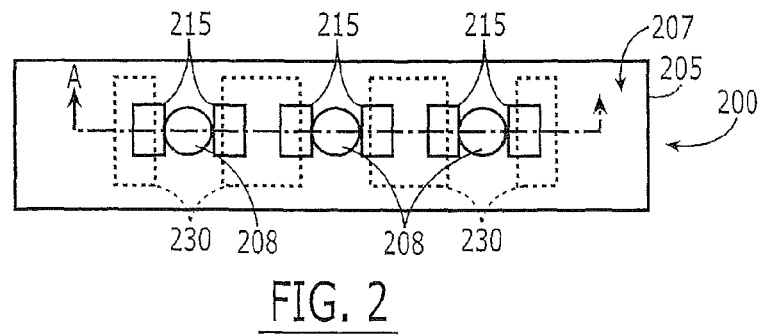
FIG. 2 is a top plan view of a packaged semiconductor light emitting device according to further embodiments of the present invention.

A packaged semiconductor light emitting device 200 according to further embodiments will now be described with reference to the schematic illustration of FIG. 2. As shown in the embodiments FIG. 2, the packaged semiconductor light emitting device 200 includes a substrate 205 and a plurality of light emitting devices 208 mounted flush on a front face 207 of the substrate 205. A plurality of electrical contacts 215 are shown on the front face 207 proximate the semiconductor light emitting devices 208. Also shown in FIG. 2 is a mask 230 covering the front side of contacts 215. As illustrated in FIG. 2, the mask 230 may not entirely cover the totality of the surface area of the contacts 215.

The semiconductor light emitting devices 208 are illustrated schematically in FIG. 2 as having a circular shape. However, it will be understood that the shape of the semiconductor light emitting devices 208 may vary and the circular representation is for purposes of describing the present invention. Furthermore, the compression molded lens 110 structures are not shown in FIG. 2. The particular arrangement of the front side contacts 215 relative to the light emitting devices 208 and the number of front side contacts 215 is for illustrative purposes and other arrangements may be provided in accordance with some embodiments of the present invention.

Methods of forming a packaged semiconductor light emitting device according to some embodiments of the present invention will now be described with reference to the cross-sectional illustrations of FIGS. 3-6 and the flow chart illustration of FIG. 9. The cross-sectional illustrations of FIGS. 3-6 are taken along the line A-A of FIG. 2. As such, it will understood that, as with the description of FIG. 2, the particular arrangement of contacts 215 and light emitting devices 208 in FIGS. 3-6 is for purposes of description of the present invention and the methods of the present invention are not limited to the particular structure or arrangement of components illustrated in the Figures.

As will be described with reference to the Figures, some embodiments of the present invention provide methods for forming packaged semiconductor light emitting devices with molded compression lenses and front face electrical contacts on a substrate. The substrate may be, for example, a ceramic substrate, a metal core printed circuit board (MCPCB), a flex circuit and/or a lead frame. For the embodiments illustrated in FIGS. 3-6, a mask or stencil, such as a polyimide film, is applied to the contacts on the substrate prior to molding. After the compression molded lenses, such as silicone lenses or the like, are applied to the substrate, a hot screen or other removal method can be used to remove the lens forming material from the front side contacts covered by the mask or stencil. However, it will be understood that further embodiments of the present invention provide manufacturing of packaged semiconductor light emitting devices including compression-molded lenses without the use of a mask or substrate. Also, different types of masks can be used as well as different methods may be used for removing residual lens forming material, such as a laser, saw, hot knife, hot wire grid and/or wire mesh.

Figure 3:
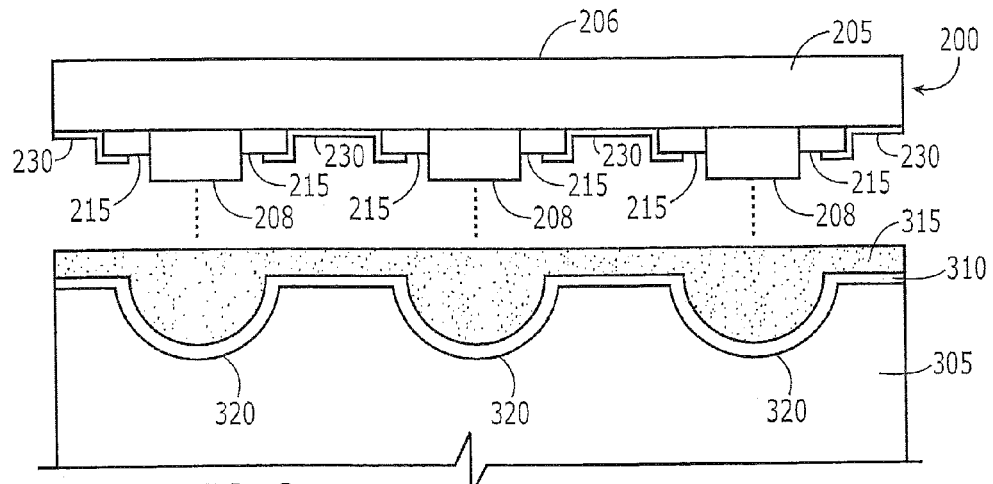
FIGS. 3 through 6 are cross sectional views illustrating a method of forming the packaged semiconductor light emitting device of FIG. 2 taken along line A-A of FIG. 2 according to some embodiments of the present invention.

As seen in the embodiments illustrated in FIG. 3, an assembly 200 including a substrate 205 with semiconductor light emitting devices 208 and front side contacts 215 on a front face 207 thereof is provided. As noted above, in the illustrated embodiments, a mask 230 is also provided covering the front side contacts 215. Also shown schematically in FIG. 3 is a compression mold 305. Mold 305 is provided with indentations or cavities 320 shaped as lenses. A cavity 320 is provided for each respective one of the illustrated plurality of light emitting devices 208. Silicone 315 is placed over the mold 305 and in the indentations 320. As also shown in FIG. 3, a release layer 310 may also be used between the silicone 315 and the mold 305. The release layer 310 may facilitate removing the mold 305 at the release layer 310 after compression molding of lenses from the silicone 315. The release layer 310 may be, for example, A flex film available from Asahi Glass Company. As seen in FIG. 3, the silicone 315 in the compression molding process illustrated fills the cavities 320 but further extends across the region between and surrounding the cavities 320, to correspondingly result in deposition on the substrate 205 of a residual coating over a region of the front face of the substrate 205 including the contact 215. Such an additional coverage of silicone 315 may occur due to the nature of the compression molding process used to form the lens or optical element in embodiments of the present invention as described herein.

Figure 4:
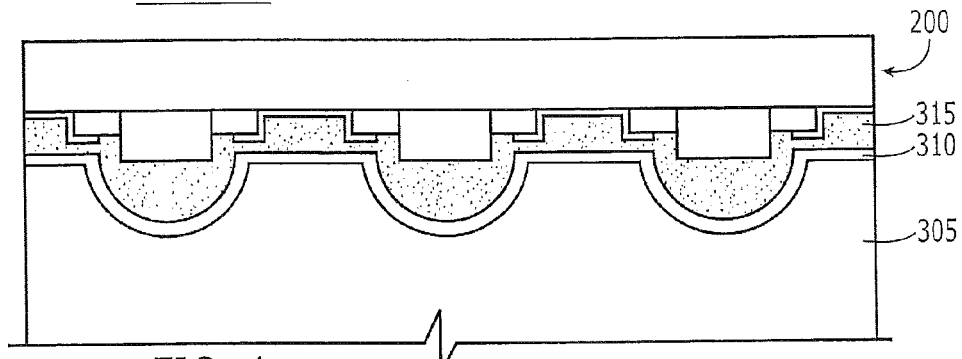

Referring now to FIG. 4, the assembly 200 is shown inserted in the mold 305 during compression molding of the substrate 205 to form optical elements on a front face of the substrate over the respective semiconductor light emitting devices 208. In some embodiments, the material used in forming the compression molded optical element and residual coating is a silicone plastic and the compression molding occurs at a temperature of about 100° C. to about 150° C. (or about 140° C. in some embodiments) for a time of about three to about ten minutes (or about five minutes in some embodiments) at a pressure of about 0.1 to about 0.6 tons/in$^2$. An example of a suitable silicone material for use in forming packaged semiconductor light emitting devices in some embodiments of the present invention is organopolysiloxane mixture.

Figure 5:
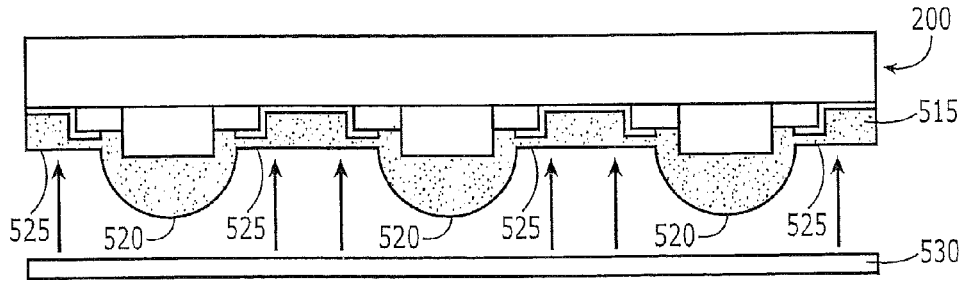

As seen in FIG. 5, after compression molding, the mold 305 is removed at the release layer 310. As such, the assembly 200 includes a compression molded optical element 520 over each of the light emitting devices 208 in addition to a residual coating 525 over a region of the front face of the substrate including the contacts 215. In other words, the compression molded silicone layer 515 includes both the residual coating 525 and the optical element 520 at the time of removal from the mold 305 as shown in FIG. 5.

FIG. 5 further illustrates use of a removal method or process used to remove the silicone located on the mask 230 while leaving a molded lens over each light emitting device 208. As particularly illustrated in FIG. 5, the removal process includes cutting the residual coating 525 in a pattern corresponding to the mask 230 with a hot knife 530 or other cutting means having a pattern corresponding to the pattern cut into the residual coating 525. In some embodiments, the hot knife 530 itself has a corresponding pattern, allowing the cutting operation to be executed with a single motion in the direction illustrated by the arrows in FIG. 5 without the need for motion in a second direction. In some other embodiments of the present invention, the cutting apparatus 530 may further make a second or third directional movement to provide for cutting the residual coating 525 as desired to expose an electrical contact portion of the contacts 215 without damaging the contacts 215.

Figure 6:
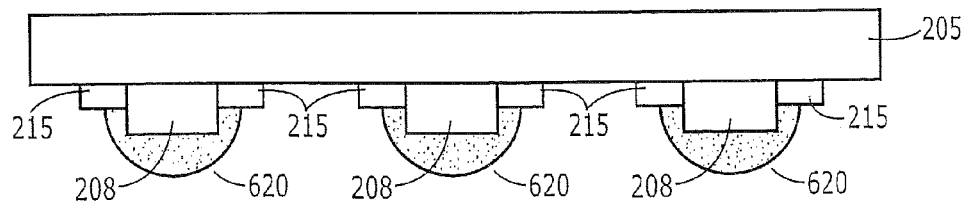

The resulting packaged semiconductor light emitting device structure after the removal operations illustrated in FIG. 5 according to some embodiments of the present invention is illustrated in FIG. 6. As seen in FIG. 6, the substrate 205 includes a plurality of light emitting devices 208 with compression molded lenses 620 formed over corresponding ones of the light emitting devices 208. The residual coating 525 over a region of the front face of the substrate 205 including a contact area of the contacts 215 has been removed, without damaging the contacts 215, to allow formation of electrical connections to the contacts 215.

Operations for forming a semiconductor light emitting device according to further embodiments of the present invention will now be described with reference to the flow chart illustration of FIG. 9. As shown in embodiments illustrated in FIG. 9, operations begin at block 900 by providing a substrate 105, 205 having contacts 115, 215 on a front face 107, 207 thereof (block 900). A semiconductor light emitting device 108, 208 is mounted on the front face 107, 207 of the substrate 105, 205 (block 905). The light emitting device 108, 208 is electrically connected to one or more of the contacts 115, 215 (block 905). Thus, the contacts 115, 215 may provide means for electrically connecting the light emitting device 108, 208 with other circuitry by forming an electrical connection on the front face of 107, 207 of the substrate 105, 205. An additional connection, or the connection referenced at block 905, may be formed by attaching a wire bond electrically connecting a respective light emitting device 108, 208 to a contact portion of the substrate 105, 205 (i.e. the contact portion may be one of the front side contacts 115, 215) (block 910).

In various embodiments, the substrate 105, 205 may be a ceramic substrate, a metal core printed circuit board (MCPCB), a flexible circuit substrate and/or a lead frame or the like. Furthermore, one or more light emitting devices 108, 208 and front side contacts 115, 215 may be provided in various respective arrangements on the substrate 105, 205 in different embodiments of the present invention. Removal of residual coating from the contacts as needed may be provided based upon a pattern suited to correspond to the selected geometry or arrangement of light emitting devices and front side contacts in various embodiments of the present invention.

Figure 9:
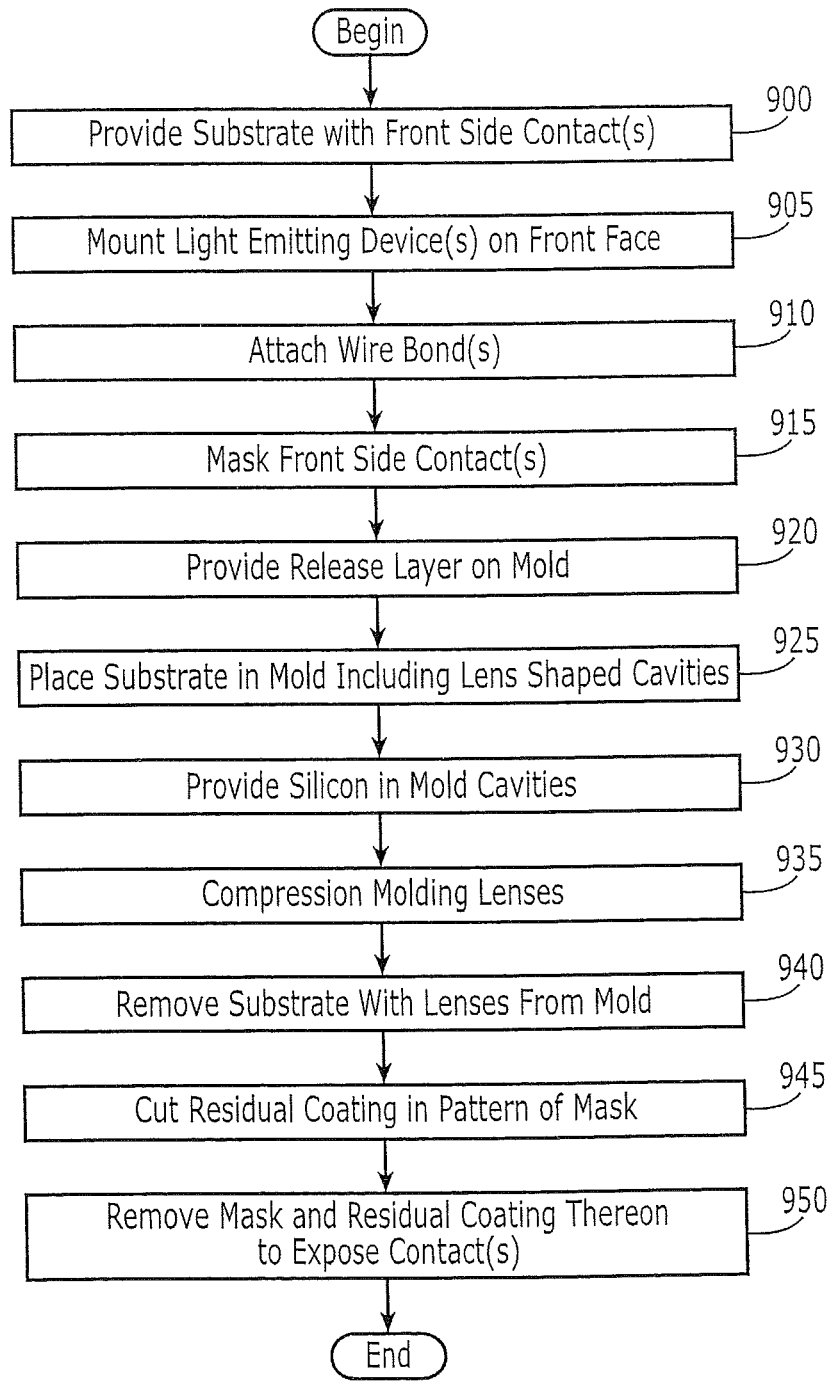
FIG. 9 is a flow chart illustrating operations for forming a packaged semiconductor light emitting device according to some embodiments of the present invention.

As shown in FIG. 9, a mask 230 is provided covering the front side contacts 115, 215 (block 915). The mask may be, for example, a polyimide film. The substrate is compression molded to form an optical element 110, 620 on the front face of the substrate 107, 207 over respective ones of the semiconductor light emitting devices 108, 208 and a residual coating over a region of the front face of the substrate including the contacts as will now be described with reference to block 920-940.

As seen in the illustrated embodiments of FIG. 9, compression molding includes providing a release layer 310 on a surface of the mold 305 including a plurality of lens shaped cavities 320 positioned proximate corresponding ones of the plurality of semiconductor light emitting devices 108, 208 (block 920). The substrate is placed in the mold 305 with the cavities positioned proximate corresponding ones of the semiconductor light emitting devices (block 925). Silicone layer 315 is provided in the mold 305 and the cavities 320 as well as a region between and around the cavities 320 (block 930). The lenses 620, 110 are compression molded from the silicone in the cavities (block 935). The substrate, with a lens formed therein, is removed from the mold (block 940).

Operations related to removing the residual coating over the contacts without damaging the contacts will now be described for some embodiments of the present invention with reference to blocks 945 and 950 of FIG. 9. The residual coating is cut in a pattern corresponding to the mask applied as described at block 915 above (block 945). In some embodiments where the substrate includes a plurality of light emitting devices and contacts on the front face, cutting the residual coating includes cutting the residual coating with a hot knife. The hot knife may have a pattern corresponding to the pattern cut in the residual coating so that the cutting operation may be provided by the advancement of the cutting knife towards the substrate without lateral movement of the cutting member across the substrate. As such, the risk of any damage to the contact surface during the removal process may be reduced. The mask and the cut, overlying residual coating thereon are removed to expose the front side contacts (block 950).

In some embodiments of the present invention, the light emitting device 108, 208 is electrically connected to a contact portion by a wire bond before compression molding of the optical element 110, 620. Furthermore, in some embodiments, the substrate is compression molded to form the optical element 110, 620 over the semiconductor light emitting device 108, 208 and directly contacting the wire bond. A compression molding process as described herein may allow such direct contact and formation of the optical element on both the wire bond and the associated light emitting device while reducing or even preventing damage to the coupling between the light emitting device and the contact portion by the wire bond. In contrast, various other methods of forming a lens of such an arrangement may require the use of additional protective applications so as to avoid damaging the connection between the wire bond and the light emitting device and the corresponding contact portion of a substrate.

Furthermore, in some embodiments of the present invention as described herein, the light emitting device may be mounted flush on the front face of the substrate and a compression molded optical element may be formed around the light emitting device in a dome extending over a full 180 degrees over the light emitting device. As such, a greater flexibility and/or efficiency in extraction and provision of light from the light emitting device may be provided through selection of the lens forming material and any additives or the like added thereto as contrasted with approaches requiring the use of a cavity of a reflective material surrounding the light emitting device. Such reflective cavities generally absorb at least some amount of the emitted light, while a lens or other optical element extending from the front face to fully surround the light emitting device mounted flush on the front face of the substrate may provide improved light extraction in various applications. However, in some embodiments, the LED could reside in a cavity or recess.

While embodiments of the present invention using a mask have been described with reference to FIGS. 3-6 and 9, it will be understood that some embodiments of the present invention do not use such a mask and cutting process. In some embodiments of the present invention, the substrate is a flexible circuit substrate and the residual coating is removed by a wet solvent chemical cleaning of the substrate to remove the residual coating over the contacts. It will be understood that, whether a mask or wet etching approach is used, the residual coating may be removed over a region of the front face of the substrate including the plurality of contacts but need not completely expose the contacts. However, a sufficient area of the contacts should be exposed to allow making of an electrical connection thereto without residual coating interfering with the electrical connection. A masking approach provided after formation of the residual coating, as contrasted to prior to compression molding, may be used in connection with the wet solvent chemical cleaning operation so as to limit removal of residual coating from desired areas in a selected pattern.

Packaged semiconductor light emitting devices according to further embodiments of the present invention will now be described with reference to the embodiments of FIGS. 7 and 8. Each include a plurality, illustrated as first and second, of optical elements formed on a substrate. It will be understood that one and/or both of the respective optical elements may be formed using compression molding in different embodiments of the present invention.

As seen in the embodiments of FIG. 7, a packaged semiconductor light emitting device 700 includes a plurality of semiconductor light emitting devices 708 mounted flush on a front face 707 of a substrate 705. A first optical element 740 is formed over each of the semiconductor light emitting devices 708. A second optical element 720 is formed over the first optical element 740 and the light emitting device 708. As further shown in the embodiments of FIG. 7, an additive 742 may be added to the second optical element 720 to affect the light transmission or emission characteristics of the semiconductor light emitting device 708. It will be understood that the additive 742 may instead be added to the first optical element 740 or a same and/or different additive may be provided in each of the optical elements 720, 740. In addition, optical properties may be further tailored by selection of different characteristics for the respective optical elements 720, 740, for example, selecting a different refractive index for the respective materials to provide a desired effect in passage of light emitting from the semiconductor light emitting device 708. Additives to affect optical properties may include a phosphor, a scatter agent, a luminescent material and/or other material affecting optical characteristics of the emitted light.

It will be understood that both the first and second optical elements may be compression molded in the embodiments of FIG. 7. However, in further embodiments, the first optical element 740 may be formed by other means and the second optical element 720 may be formed by compression molding generally as described above with reference to FIGS. 3-6 and FIG. 8.

Figure 8:
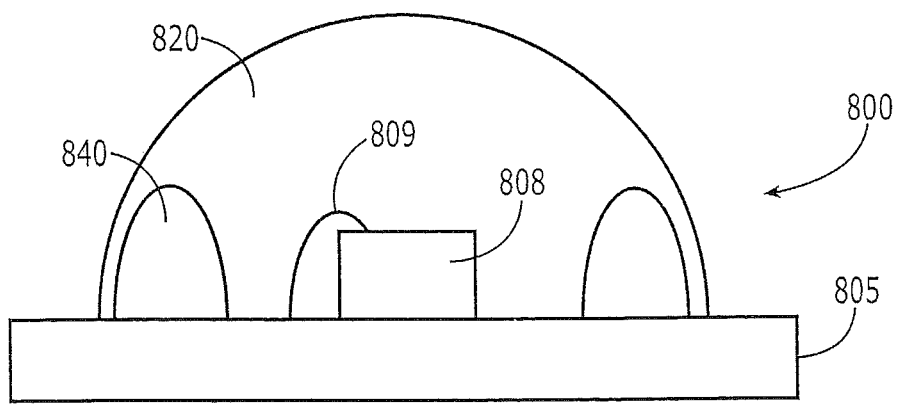
FIG. 8 is a cross sectional view of a packaged semiconductor light emitting device according to further embodiments of the present invention.

Further embodiments of a packaged semiconductor light emitting device 800 are illustrated in FIG. 8. As seen in the embodiments of FIG. 8, a semiconductor light emitting device 808 is mounted flush on a front face of a substrate 805. A wire bond 809 is shown making a connection between the substrate 805 and the semiconductor light emitting device 808. While not seen in FIG. 8, it will be understood that a second connection may be formed at the interface between the light emitting device 808 and the front face of the substrate 805.

A first optical element 840 is formed proximate a light emitting device 808 on the front face of the substrate 805. A second optical element 820 is formed over the light emitting device 808, the wire bond 809 and the first optical element 840. As described with reference to FIG. 7, one or both of the respective optical elements 840, 820 may be formed by compression molding generally as described previously herein. Furthermore, the first optical element 840, while appearing as two discrete elements in the cross sectional view of FIG. 8, may be a toroidal shaped single optical element extending around the light emitting device 808 and wire bond 809.

Further embodiments of methods for forming a packaged semiconductor light emitting device will now be described with reference to the flowchart illustration of FIG. 10. More particularly, the methods described with reference to FIG. 10 may be used in forming the devices illustrated in FIG. 7 or FIG. 8. For purposes of the description of FIG. 10, embodiments in which both the optical elements are compression molded in an automated molding apparatus will be described. However, it will be understood that the invention is not limited to such embodiments. Furthermore, it will be understood the operations as described with reference to compression molding may be used in some embodiments with the substrate having contacts on a front face thereof and removal of a residual portion of the molding material to expose the front face contacts as described previously herein.

Figure 10:
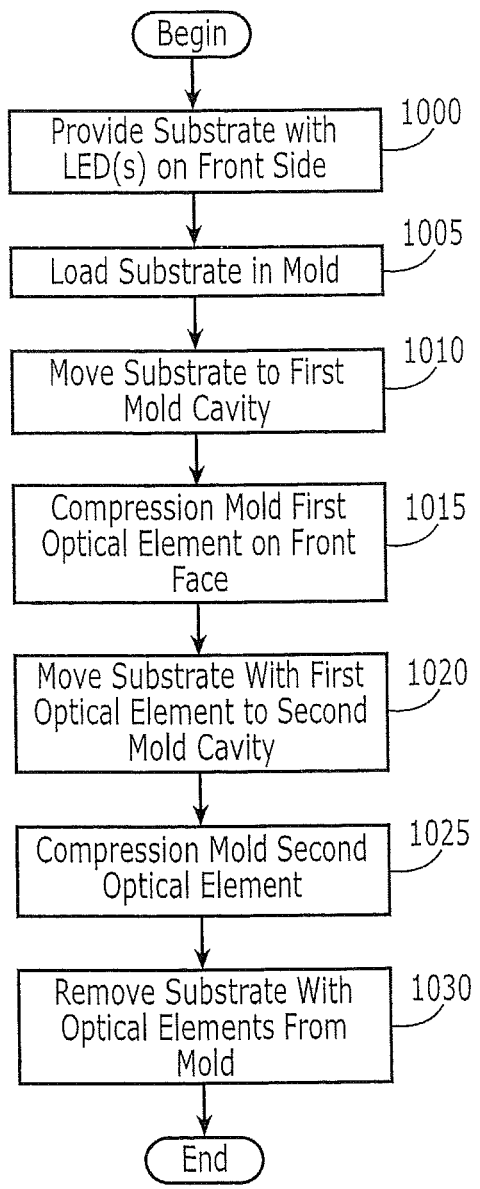
FIG. 10 is a flow chart illustrating operations for forming a packaged semiconductor light emitting device according to other embodiments of the present invention.

For the embodiments illustrated in FIG. 10, operations begin with providing a substrate having a semiconductor light emitting device on a front face thereof (block 1000). As discussed previously, the substrate may include a plurality of semiconductor light emitting devices on the front face thereof, such as illustrated in FIGS. 1 and 2. Furthermore, the semiconductor light emitting devices may be mounted flush on the front face of the substrate without a reflector cavity. The substrate may be, for example, a ceramic substrate, a MCPCB, a flexible circuit substrate and/or a lead frame. However, the light emitting devices may be mounted in a reflector cavity or the like.

Operations related to forming first and second optical elements of the packaged semiconductor light emitting device will now be described with reference to blocks 1005-1030. The substrate is loaded in an automated molding apparatus including a first mold cavity configured to form the first optical element and a second mold cavity configured to form the second optical element (block 1005). The first and second mold cavities may each include a plurality of lens shaped cavities positioned proximate corresponding ones of the plurality of semiconductor light emitting devices where the substrate includes a plurality of semiconductor light emitting devices thereon. The substrate is moved to the first mold cavity (block 1010). The movement may be by automated conveyor, robotic arm and/or the like within the automated molding apparatus.

The first optical element is compression molded on the front face of the substrate in the first mold cavity (block 1015). It will be understood that, while shown as compression molding at block 1015, the first optical element or the second optical element may be formed using a process other than compression molding, such as dispensing and/or bonding. Furthermore, the first optical element may be formed at block 1015 proximate the semiconductor light emitting device but not covering the semiconductor light emitting device as illustrated, for example, by the optical element 840 in FIG. 8. The first optical element may also in some embodiments be formed at block 1015 molded to and extending from the front face of the substrate in a region surrounding the semiconductor light emitting device and extending over the semiconductor light emitting device as shown for the first optical element 740 in the embodiments of FIG. 7. In some embodiments, where the first optical element does not extend over the light emitting device, the first optical element may be shaped to define a cavity with the semiconductor light emitting device positioned in the cavity.

The substrate with the first optical element thereon is moved to the second mold cavity without requiring removal of the substrate from the automated molding apparatus (block 1020). For example, a conveyor or robotic tool, such as described with reference to operations at block 1010, may also be used for operations at block 1020.

The second optical element is compression molded in the second optical cavity (block 1025). As described with reference to the first optical element illustrated in FIG. 8, the second optical element may be molded to extend from the front of the substrate in a region surrounding the semiconductor light emitting device and extend over the light emitting device as seen with the second optical element 720 in FIG. 7 and the second optical element 820 in FIG. 8. The substrate with the first and second optical elements thereon is removed from the automated molding apparatus (block 1030).

As also seen in both FIG. 7 and FIG. 8, the second optical element may be compression molded over both the semiconductor light emitting device and the first optical element. The first optical element and the second optical element may have different refractive indexes selected to provide a desired optical characteristic for the packaged semiconductor light emitting device. The first and second optical element may be configured to provide a selected viewing angle to the packaged semiconductor light emitting device. In some embodiments, the material used in forming the first and/or second optical element has an adhesion characteristic selected to facilitate adhesion of the first optical element to the substrate during compression molding and/or to limit stress applied to the light emitting device and/or a wire bond coupled thereto during thermal cycling of the packaged semiconductor light emitting device. The first optical element material and/or the second optical element material may include a phosphor. The first material and/or the second material may be silicone, epoxy, a hybrid silicone/epoxy material and/or the like.

As described above, some embodiments of the present invention provide packaged semiconductor light emitting devices and methods for forming the same using compression molding to produce lens having tailored optical properties. For example, light emitting devices packaged with composite lenses produced using compression molding may be provided. In some embodiments, multiple compression molds may be used to produce compression molded lenses where both the first and the second optical elements are compression molded to produce lenses having desired optical properties, such as viewing angles. In other embodiments, a first optical element may be dispersed, bonded or the like and the second optical element may be compression molded. As such, the first and second optical elements may have different properties (shape, composition, refractive index, and so on) tailored to the needs of the application of the packaged device. Some embodiments may also include additional optical elements, layers and/or compression molds in addition to the first and second optical element. Furthermore, the shape and composition of each optical element may be different from one another and may be tailored to provide a desired lamp performance. Improved adherence and/or lower stress on compliant parts may be provided in various embodiments of the present invention In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A packaged semiconductor light emitting device, comprising:
a substrate;
a semiconductor light emitting device on a front face of the substrate;
a first optical element on the front face of the substrate proximate the semiconductor light emitting device but not covering the semiconductor light emitting device, wherein the first optical element comprises a ring around the semiconductor light emitting device having a curved top and wherein the ring comprises a toroidal shape; and
a second optical element on the front face of the substrate over the semiconductor light emitting device and the first optical element, wherein the first and second optical elements comprise different materials to provide the first optical element and the second optical element different refractive indexes selected to provide a desired optical characteristic for the packaged semiconductor light emitting device.

2. The device of claim 1, wherein the semiconductor light emitting device is flush on the front face of the substrate without a reflector cavity and wherein the second optical element extends from the front face of the substrate in a region surrounding the semiconductor light emitting device and extends over the semiconductor light emitting device.

3. The device of claim 1, further comprising a wire bond that electrically couples the semiconductor light emitting device to a contact portion the substrate and wherein the second optical element is a compression molded optical element that directly contacts the wire bond.

4. The device of claim 3, wherein the second optical element comprises a first material having an adhesion characteristic selected to facilitate adhesion of the first optical element to the substrate during compression molding and to limit stress applied to the light emitting device and/or a wire bond coupled thereto during thermal cycling of the packaged semiconductor light emitting device.

5. The device of claim 1, wherein the desired optical characteristic comprises a selected viewing angle of the packaged semiconductor light emitting device.

6. The device of claim 1, wherein the first optical element extends entirely around the light emitting device.

7. The device of claim 1, wherein the first optical element comprises an additive.

8. The device of claim 1, wherein the second optical element comprises an additive.

9. The device of claim 1, wherein the first optical element comprises a first additive and the second optical element comprises a second additive different form the first additive.

10. The device of claim 1, wherein the first optical element comprises an additive such that the first optical element provides greater efficiency in light extraction from the semiconductor light emitting device than a reflective cavity.

11. The device of claim 1, wherein the ring is symmetrical along a vertical axis orthogonal to a radius of the ring at any point on the ring.

12. A packaged semiconductor light emitting device, comprising:

a substrate;

a semiconductor light emitting device on a front face of the substrate;

a first optical element on the front face of the substrate proximate the semiconductor light emitting device but not covering the semiconductor light emitting device, wherein the first optical element comprises a ring around the semiconductor light emitting device having a curved top; and a second optical element on the front face of the substrate over the semiconductor light emitting device and the first optical element, wherein the second optical element directly contacts the semiconductor light emitting device, wherein the second optical element directly contacts an entire external surface of the first optical element that is not contacting the front face of the substrate and wherein the optical elements comprise a material different from a material of the substrate, and wherein at least one of the first and second optical elements comprises an additive to affect optical properties.

13. The device of claim 12, wherein the first optical element extends entirely around the light emitting device.

* * * * *